US009474156B2

United States Patent
Fosnes et al.

(10) Patent No.: US 9,474,156 B2
(45) Date of Patent: Oct. 18, 2016

(54) INTERPOSER CONNECTORS WITH ALIGNMENT FEATURES

(75) Inventors: Greg Fosnes, Redwood City, CA (US); Aaron Miletich, San Carlos, CA (US); Chris Ligtenberg, San Carlos, CA (US); Jay Anastas, San Carlos, CA (US); Erik James Shahoian, Sonoma, CA (US); Eric Knopf, Mountain View, CA (US); Peter Arnold, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 746 days.

(21) Appl. No.: 13/492,895

(22) Filed: Jun. 10, 2012

(65) Prior Publication Data

US 2013/0148322 A1    Jun. 13, 2013

Related U.S. Application Data

(63) Continuation-in-part of application No. 13/370,276, filed on Feb. 9, 2012.

(60) Provisional application No. 61/441,645, filed on Feb. 10, 2011.

(51) Int. Cl.
*H05K 7/00* (2006.01)
*H05K 1/14* (2006.01)
(Continued)

(52) U.S. Cl.
CPC .............. *H05K 1/141* (2013.01); *H01R 12/73* (2013.01); *H05K 1/144* (2013.01); *H05K 3/368* (2013.01); *H05K 2201/0311* (2013.01); *H05K 2201/042* (2013.01); *H05K 2201/09027* (2013.01); *H05K 2201/09063* (2013.01); *H05K 2201/10378* (2013.01); *H05K 2201/10409* (2013.01); *H05K 2203/167* (2013.01); *Y10T 29/49147* (2015.01)

(58) Field of Classification Search
CPC  H01L 25/0657; H05K 7/142; H05K 7/1417; H05K 3/301; H05K 5/0256; H05K 3/306; G06F 1/184
See application file for complete search history.

(56) References Cited

U.S. PATENT DOCUMENTS

| 4,935,696 A | * | 6/1990 | DiPerna | ..................... | 324/750.2 |
| 4,948,379 A |   | 8/1990 | Evans |   |   |
| 5,259,781 A | * | 11/1993 | Baumberger | ...... | H01R 13/2435 439/331 |

(Continued)

OTHER PUBLICATIONS

Non-Final Office Action mailed on May 13, 2014 for U.S. Appl. No. 13/455,112, 19 pages.

(Continued)

*Primary Examiner* — Xanthia C Cunningham
(74) *Attorney, Agent, or Firm* — Kilpatrick Townsend & Stockton LLP

(57) ABSTRACT

Non-rectangular or rectangular interposers for space efficient, reliable to manufacture, high speed interconnections between two printed circuit boards, such as a motherboard and a mating board. One example provides space efficiency with a non-rectangular interposer, where the interposer may be at least approximately circular. Reliable manufacturing may be provided by the inclusion of one or more openings to accept one or more alignment features. In one example, a first opening is provided to accept a threaded boss, which may be used to fasten the two printed circuit boards and interposer together. In another example, a second opening may be provided to accept an alignment post, wherein the post aligns the interposer to the two printed circuit boards. Contacts may be provided on each side to mate with contacts on each of the two printed circuit boards.

21 Claims, 13 Drawing Sheets

(51) Int. Cl.
*H01R 12/73* (2011.01)
*H05K 3/36* (2006.01)

(56) References Cited

U.S. PATENT DOCUMENTS

| | | | |
|---|---|---|---|
| 5,348,488 A * | 9/1994 | Green et al. | 439/140 |
| 5,383,787 A | 1/1995 | Switky et al. | |
| 5,462,441 A | 10/1995 | Renn et al. | |
| 5,653,600 A | 8/1997 | Ollivier | |
| 5,726,433 A | 3/1998 | Peng | |
| 5,729,433 A * | 3/1998 | Mok | 361/704 |
| 5,738,531 A * | 4/1998 | Beaman | G01R 1/0483 257/E23.067 |
| 5,759,047 A * | 6/1998 | Brodsky et al. | 439/66 |
| 5,810,607 A | 9/1998 | Shih et al. | |
| 5,950,070 A * | 9/1999 | Razon et al. | 438/113 |
| 5,984,691 A * | 11/1999 | Brodsky et al. | 439/66 |
| 6,303,992 B1 | 10/2001 | Van Pham et al. | 257/734 |
| 6,354,844 B1 * | 3/2002 | Coico et al. | 439/66 |
| 6,384,311 B1 | 5/2002 | Cota | |
| 6,384,331 B1 * | 5/2002 | Ku | 174/548 |
| 6,449,155 B1 * | 9/2002 | Colbert | H01L 23/4006 165/185 |
| 6,477,058 B1 * | 11/2002 | Luebs et al. | 361/784 |
| 6,483,043 B1 * | 11/2002 | Kline | 174/262 |
| 6,493,233 B1 * | 12/2002 | De Lorenzo et al. | 361/752 |
| 6,541,989 B1 * | 4/2003 | Norris et al. | 324/754.03 |
| 6,710,611 B2 | 3/2004 | Saulnier et al. | |
| 6,882,169 B2 * | 4/2005 | Maruyama et al. | 324/756.05 |
| 6,927,083 B2 * | 8/2005 | Kline | 438/17 |
| 6,933,617 B2 * | 8/2005 | Pierce | 257/786 |
| 6,967,494 B2 * | 11/2005 | Kline | 324/754.18 |
| 7,017,258 B2 * | 3/2006 | Eckblad et al. | 29/729 |
| 7,029,289 B2 | 4/2006 | Li | |
| 7,170,306 B2 * | 1/2007 | Karavakis | G01R 1/0408 29/825 |
| 7,301,358 B2 * | 11/2007 | Jovanovic | G01R 1/07378 29/874 |
| 7,894,172 B2 * | 2/2011 | Pan et al. | 361/56 |
| 7,944,200 B2 * | 5/2011 | Endo et al. | 324/750.3 |
| 8,708,729 B2 | 4/2014 | An et al. | |
| 2004/0060733 A1 * | 4/2004 | Brodsky | 174/260 |
| 2004/0165366 A1 * | 8/2004 | Schnabel et al. | 361/796 |
| 2004/0196682 A1 | 10/2004 | Funaba et al. | |
| 2004/0259332 A1 * | 12/2004 | Fukuoka et al. | 438/464 |
| 2005/0079748 A1 * | 4/2005 | Kim | 439/92 |
| 2005/0237074 A1 * | 10/2005 | Karavakis et al. | 324/754 |
| 2005/0275420 A1 * | 12/2005 | Colbert | H05K 7/1061 324/750.25 |
| 2005/0286238 A1 * | 12/2005 | Joy | 361/761 |
| 2006/0022692 A1 * | 2/2006 | LaMeres | G01R 1/07371 324/750.16 |
| 2006/0038287 A1 * | 2/2006 | Hamasaki et al. | 257/726 |
| 2006/0078248 A1 * | 4/2006 | Sasaki | G02B 6/4214 385/14 |
| 2006/0186096 A1 * | 8/2006 | Schramm | 219/121.69 |
| 2006/0244475 A1 * | 11/2006 | Kirby et al. | 324/765 |
| 2006/0284309 A1 * | 12/2006 | Park et al. | 257/731 |
| 2007/0200222 A1 * | 8/2007 | Ehmke et al. | 257/704 |
| 2007/0212200 A1 * | 9/2007 | Ueda et al. | 414/217 |
| 2007/0222339 A1 * | 9/2007 | Lukacs et al. | 310/335 |
| 2008/0020596 A1 * | 1/2008 | Hougham et al. | 439/65 |
| 2008/0036071 A1 * | 2/2008 | Li | G01R 31/2886 257/700 |
| 2008/0158746 A1 * | 7/2008 | Anthony et al. | 361/56 |
| 2008/0160681 A1 * | 7/2008 | Anthony et al. | 438/129 |
| 2008/0318348 A1 | 12/2008 | Grupen-Shemansky | |
| 2009/0040739 A1 * | 2/2009 | Hamasaki et al. | 361/772 |
| 2009/0278246 A1 * | 11/2009 | Hoshino et al. | 257/686 |
| 2010/0105221 A1 * | 4/2010 | Miyamoto | 439/76.2 |
| 2010/0294358 A1 * | 11/2010 | Nakanishi et al. | 136/256 |
| 2011/0019383 A1 | 1/2011 | Aoyama et al. | |
| 2012/0064738 A1 * | 3/2012 | Shelsky | G01R 31/2889 439/65 |
| 2012/0104543 A1 | 5/2012 | Shahoian | |
| 2012/0206892 A1 | 8/2012 | Shahoian et al. | |
| 2012/0302095 A1 | 11/2012 | Shahoian | |

OTHER PUBLICATIONS

Final Office Action mailed on Apr. 15, 2014 for U.S. Appl. No. 13/249,260, 34 pages.
Final Office Action mailed on May 15, 2014 for U.S. Appl. No. 13/370,276, 23 pages.
Display Port, Wikipedia, the free encyclopedia, 4 pages; printed on Aug. 29, 2008 from http://en.wikipedia.org/wiki/Displayport; page states it was last modified on Aug. 25, 2008.
Dopplinger, A., et al. "Using IEEE 1588 for synchronization of network-connected devices", Mar. 29, 2007, from www.embedded. com/columns/technicalinsights/, 7 pages.
Ethernet, Wikipedia, the free encyclopedia, 9 pages; printed on Aug. 17, 2008, from http://en.wikipedia.org/wiki/Ethernet; page states it was last modified on Aug. 17, 2008.
IDT 24-Lane 3-Port PCI Express, 89HPES24N3 Data Sheet, Jul. 18, 2006, 30 pages.
IEEE 1394 interface, Wikipedia, the free encyclopedia, 7 pages; printed on Jul. 24, 2008 from http://en.wikipedia.org/wiki/Firewire; page states it was last modified on Jul. 23, 2008.
PCI Express Architecture, Chapter 3, Address Spaces & Transaction Routing, from PCIEX.book, pp. 105-152, Aug. 5, 2003.
PCI Express Base Specification Revision 1.0a, Apr. 15, 2003, pp. 1-426.
PCI Express, Wikipedia, the free encyclopedia, 11 pages; printed on Jul. 24, 2008 from http://en.wikipedia.org/wiki/PCI-Express; page states it was last modified on Jul. 16, 2008.
PCI-X, Wikipedia, the free encyclopedia, 4 pages; printed on Sep. 9, 2008 from http://en.wikipedia.org/wiki/PCI-X; page states it was last modified on Sep. 4, 2008.
Peer-to-peer, Wikipedia, the free encyclopedia, 11 pages; printed on Jul. 24, 2008 from http://en.wikipedia.org/wiki/Peer-to-peer; page states it was last modified on Jul. 24, 2008.
Peripheral Component Interconnect, Wikipedia, the free encyclopedia, 7 pages; printed on Jul. 24, 2008, from http://en.wikipedia.org/wiki/PCI_%28bus%29; page states it was last modified on Jul. 23, 2008.
Universal Serial Bus, Wikipedia, the free encyclopedia, 17 pages; printed on Jul. 24, 2008 from http://en.wikipedia.org/wiki/USB; page states it was last modified on Jul. 23, 2008.
VESA DisplayPort Standard, Version 1, Revision 1a, Jan. 11, 2008, 238 pages.
Non-Final Office Action mailed on Dec. 6, 2013 for U.S. Appl. No. 13/370,276, 18 pages.
Non-Final Office Action mailed on Sep. 9, 2013 for U.S. Appl. No. 13/249,260, 21 pages.
Notice of Allowance mailed on Jan. 7, 2015 for U.S. Appl. No. 13/455,112, 6 pages.

* cited by examiner

INTERPOSER CONNECTORS WITH ALIGNMENT FEATURES

CROSS-REFERENCES TO RELATED APPLICATIONS

This application is a continuation-in-part of U.S. patent application Ser. No. 13/370,276, filed Feb. 9, 2012, and claims the benefit of U.S. provisional patent application No. 61/441,645, filed Feb. 10, 2011, which is incorporated by reference.

BACKGROUND

The number and types of electronic devices available to consumers have increased tremendously the past few years, and this increase shows no signs of abating. Devices such as portable computing devices, tablet, desktop, and all-in-one computers, cell, smart, and media phones, storage devices, portable media players, navigation systems, monitors and other electronic devices have become ubiquitous.

These electronic devices have been packing an ever increasing amount of functionality into ever decreasing sized packages. This has led to the use of increasingly complex logic boards, as well as increases in the numbers of logic boards in these devices. One way to pack in more circuit boards has been to stack them inside these devices. But these stacks often require complex interconnections. The result of this is that these stacks of printed circuit boards are often thicker than desirable.

Moreover, the amount of data being transferred between these circuit boards has been increasing, thereby necessitating increases in data rates of signals conveyed by lines connecting the boards. Solving these problems has been further complicated by the goal of wanting to have an interconnection scheme that is simple and reliable to manufacture.

Also, to increase the functionality and reduce device size it may be helpful to make such interconnections space efficient.

Thus, what is needed are circuits, methods, and apparatus that provide a reliable, space efficient, high-speed interconnections between stacked printed circuit boards.

SUMMARY

Accordingly, embodiments of the present invention provide reliable, space efficient, high-speed interconnections between stacked printed circuit boards or other electrical components.

An exemplary embodiment of the present invention provides a space efficient interconnection by providing a non-rectangular interposer that resides between two printed circuit boards, such as a motherboard or main logic board, and a mating board. This non-rectangular interposer may be circular, elliptical, oblong, or it may have other shapes. In other embodiments of the present invention, the interposer may be square or rectangular. Contacts may be located on each side of the interposer to mate with corresponding contacts on a motherboard and a mating board.

Another exemplary embodiment of the present invention provides a reliable interconnection by providing one or more alignment features between an interposer and two printed circuit boards, such as a motherboard and a mating board. In a specific embodiment of the present invention, one of the alignment features is a threaded boss. This threaded boss may be attached to a motherboard. The interposer and the mating board may have openings arranged to accept the threaded boss. A screw may be inserted into the threaded boss to attach the motherboard, interposer, and mating board together. A washer may be used to improve mechanical stability.

In another exemplary embodiment of the present invention, a collet, set screw, and bolt may be used to fasten a main logic board to a non-rectangular interposer and mating board. Specifically, a passage may be formed together or separately through a main logic board, interpose, and mating board. The passage may extend through the main logic board as a through hole, or partially through the main logic board as a blind hole. A collet may be inserted into the passage. A set screw may be screwed into the collet until it reaches the main logic board. A bolt may then be inserted into the collet. The bolt may have a head to provide a force keeping the interposer in contact with the main logic board and the mating board. A spring may be placed between the collet and a portion of the mating board for mechanical stability. In other embodiments of the present invention, other types of fasteners, such as conical pins, may be used as an alignment feature and to fasten motherboard, interposer, and mating board together.

In another exemplary embodiment of the present invention, a screw may be used to fasten a main logic board to a non-rectangular interposer and mating board. Specifically, a screw may pass through a backer plate or washer, mating board, interposer, main-logic board, and thread into a second backer plate. The top backer plate may have a raised portion to surround a head of the screw to provide a low profile for the fastener.

In another exemplary embodiment of the present invention, an alignment post may be used to provide a second alignment feature. This alignment post may be attached to a motherboard. The interposer and mating board may have openings arranged to accept the alignment post. A top backer plate may have a notch where the alignment post may fit. With two alignment features thus provided, contacts between a motherboard and interposer, and between an interposer and a mating board, may be reliably made.

In another exemplary embodiment of the present invention, an alignment pin may be used to provide a third alignment feature. This third alignment feature may help prevent "clocking" or turning of the interposer as a screw passing through the interposer is tightened. The alignment pin may be attached to a motherboard or main-logic board. The alignment pin may be approximately the height of the interposer, and may fit in a notch in the interposer.

In another exemplary embodiment of the present invention, high-speed interconnections through the interposer may be made by forming short, direct connections between contacts on a first side and contacts on a second side. In a specific embodiment of the present invention, contacts on an interposer are formed of one or more spring like contacts, while contacts on a motherboard and mating board may be surface contacts. In other embodiments of the present invention, contacts on either or both the motherboard and mating board may be spring-like contacts, while contacts on one or both sides of the interpose may be surface contacts.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
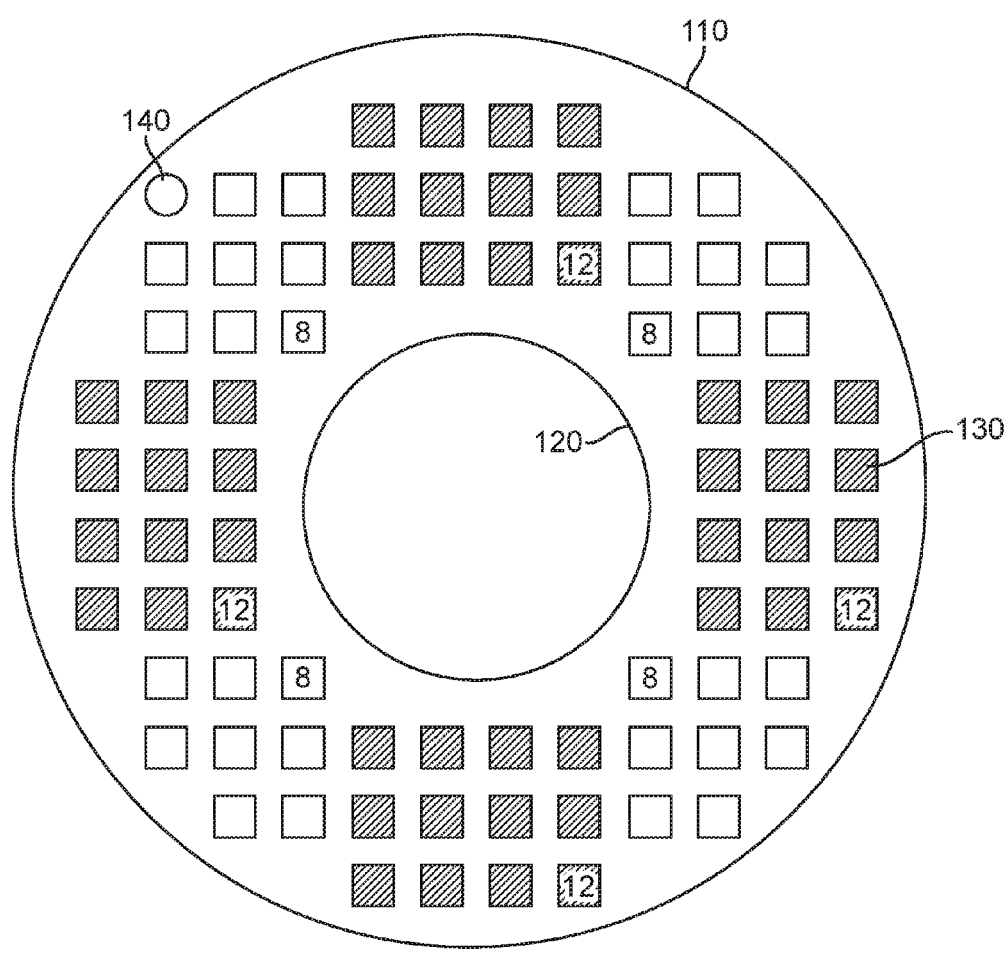
FIG. 1 illustrates a top view of an interposer according to an embodiment of the present invention.

FIG. 1 illustrates a top view of interposer 110 according to an embodiment of the present invention. This figure, as with the other included figures, is shown for illustrative purposes and does not limit either the possible embodiments of the present invention or the claims.

Interposer 110 may be used to form interconnections between two electronic components, such as two printed circuit boards, one printed circuit board and a plurality of wires, one printed circuit board and one flexible circuit board, or other components. Interposer 110 may have a non-square or non-rectangular shape to provide a space efficient interconnection between printed circuit boards or other components. In the example shown, interposer 110 may be at least approximately circular, though in other embodiments of the present invention, interposer 110 may have other shapes. For example, interposer 110 may have an elliptical or oblong shape. In a specific embodiment of the present invention, interposer 110 is at least approximately circular in shape and has a diameter of 13.2 mm, though in other embodiments of the present invention, interposer 110 may have different sizes.

In this example, interposer 110 includes openings 120 and 140. Openings 120 and 140 may accept alignment features, which may be attached to or otherwise in relationship to a printed circuit board, mating board, or other electronic component. In a specific embodiment of the present invention, opening 120 is arranged to accept a threaded boss or collet that is fixed to a motherboard. In another specific embodiment of the present invention, opening 140 is arranged to accept an alignment post that is fixed to a motherboard. In this way, interposer 110 may be aligned to a motherboard. For example, interposer 110 may be aligned by aligning opening 120 with an opening on the motherboard, with threaded boss or collet, then turning or adjusting interposer 110 until opening 140 aligns with the alignment post.

Interposer 110 may include a number of contacts 130. In this example, interposer may have 80 contacts, though in other embodiments of the present invention, interposer 110 may have different numbers of contacts. These contacts 130 may be arranged in various patterns. In a specific embodiment of the present invention, contacts 130 may have a 1.0 mm pitch, though in other embodiments of the present invention, contacts 130 may have different pitches. These contacts 130 may be square shaped, or that may have other shapes. For example, contacts 130 may be circular in nature. Interposer 110 may have contacts 130 on a top, as shown, and on a bottom side. Contacts 130 may be flat, plated areas, or they may include one or more spring-like or other types of contacts. An example is shown in the following figure.

Figure 2:
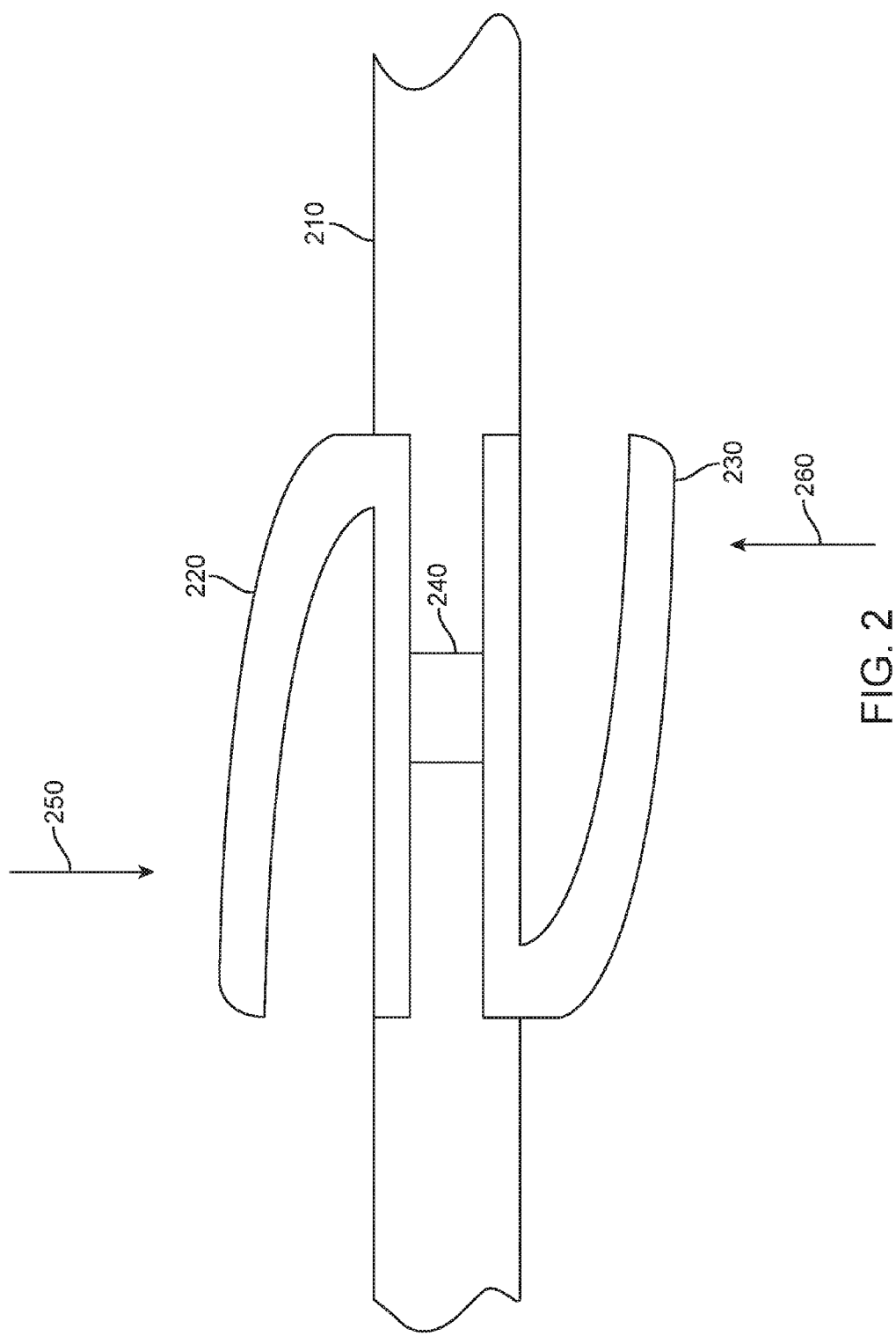
FIG. 2 illustrates a cross section of a portion of a contact that may be incorporated on an interposer according to an embodiment of the present invention.

FIG. 2 illustrates contacts, or portions of contacts, on a first and second side of an interposer 210 according to an embodiment of the present invention. A spring contact 220 resides on a top or first side of interposer 210. Contact 220 may form an entire contact, or two or more than two contacts 220 may form a single contact, such as contact 130. Similarly, spring contact 230 resides on a bottom or second side of interposer 210. Contacts 230 may form an entire contact, or two or more than two contacts 230 may form a single contact, such as contact 130.

In this example, contact 220 is associated with contact 230, and they are connected together via connection 240. In other embodiments of the present invention, contact 220 and contact 230 may not be vertically aligned.

Once interposer 210 is placed on a motherboard, spring contacts 230 compresses in a direction 260. Similarly, when a mating board is placed over interposer 210, spring contacts 220 compresses in the direction 250. These spring tensions associated with contacts 220 and 230 provide a reliable electronic connection between contacts on a motherboard and a mating board and interposer 210.

Again, contacts on a bottom side of interposer 210 may be arranged to mate with contacts on a motherboard. An example is shown in the following figure.

Figure 3:
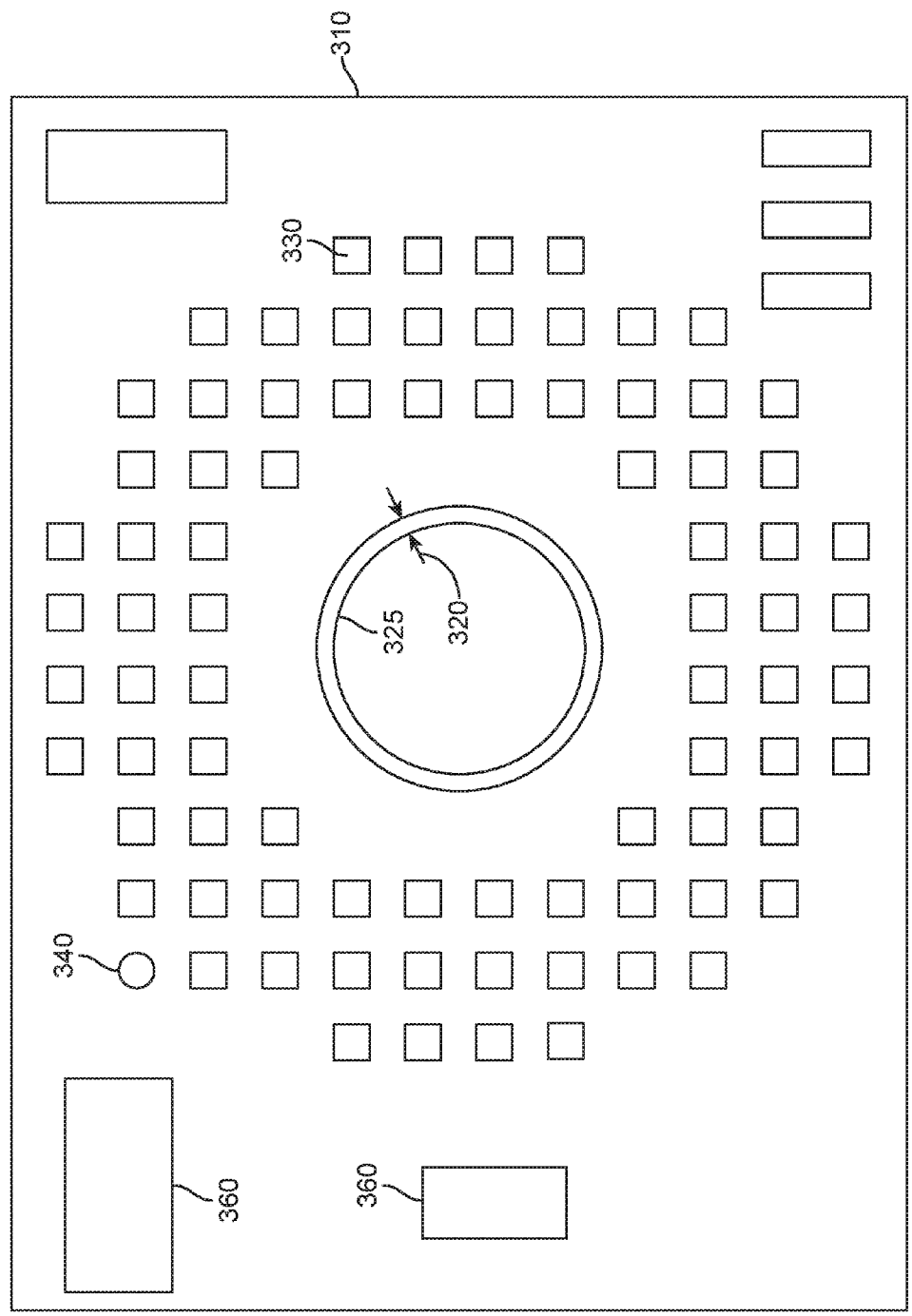
FIG. 3 illustrates a top view of a portion of a motherboard according to an embodiment of the present invention.

FIG. 3 illustrates a portion of a motherboard 310 according to an embodiment of the present invention. Motherboard 310 may include a number of contacts 330, which may be arranged to mate with contacts on a bottom side of interposer 110. As before, these contacts may be arranged in other patterns, and they may have other shapes. For example, contacts 330 may be circular.

Motherboard 310 may include an opening, or threaded boss or collet 320. Threaded boss or collet 320 may have threads along an internal wall 325. Motherboard 310 may further include an alignment post 340. Threaded boss or collet 320 and alignment post 340 may ensure proper alignment of an interposer and a mating board to motherboard 310. Motherboard 310 may include other electronic components, such as components 360, and interconnect lines (not shown).

Again, an interposer according to an embodiment of the present invention may include contacts on a bottom side to mate with contacts 330 on motherboard 310. The interposer may further include contacts on a top side to mate with contacts on a bottom side of a mating board. An example of such a mating board is shown in the following figure.

Figure 4:
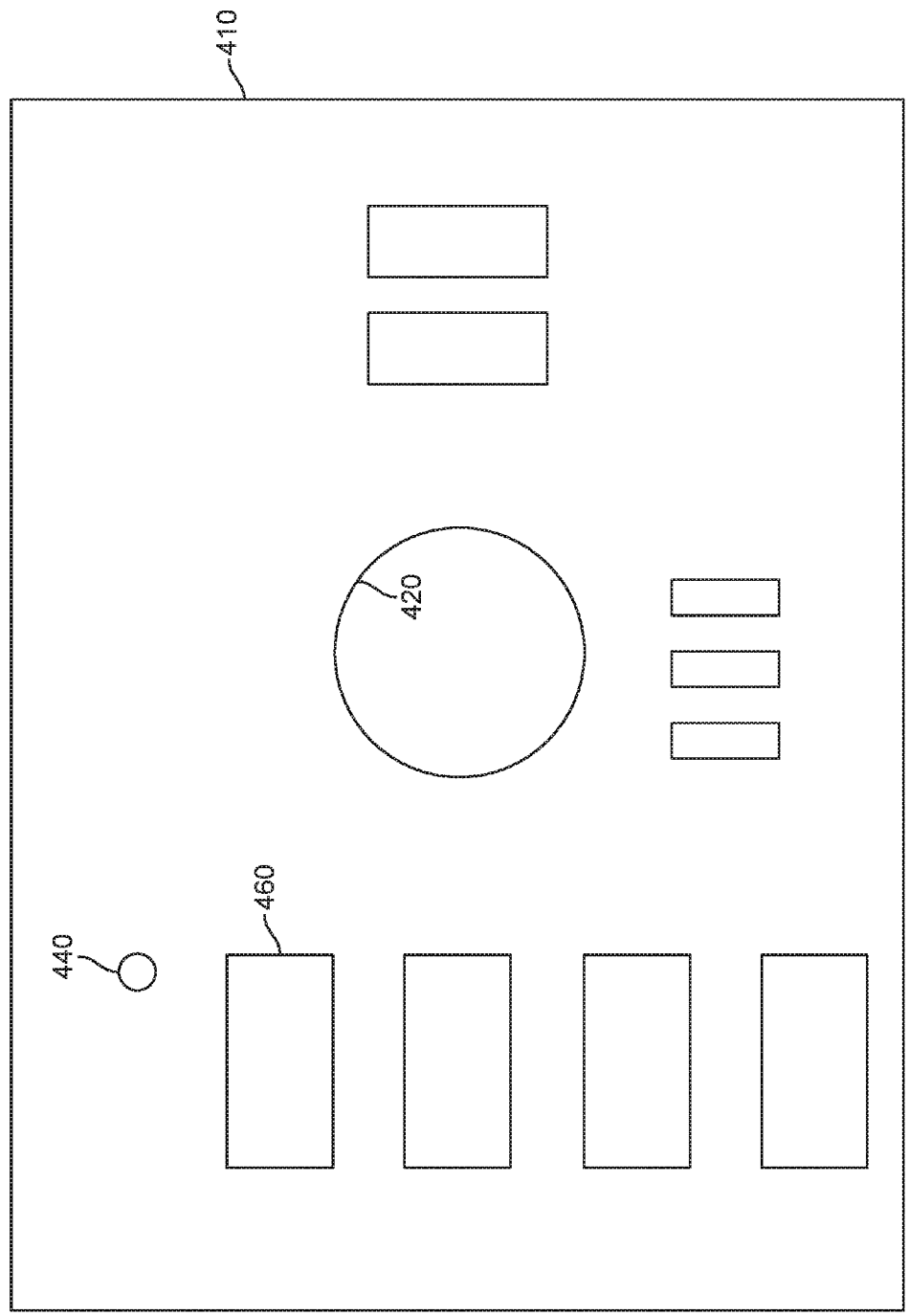
FIG. 4 illustrates a top view of a portion of a mating board according to an embodiment of the present invention.

FIG. 4 illustrates a top view of a portion of a mating board 410 according to an embodiment of the present invention. Mating board 420 includes a first opening 420 for accepting threaded boss or collet 320. Mating board 410 may also include a second opening 440 for accepting alignment post 340 on motherboard 310. As with the interposer 110, mating board 410 may be aligned to motherboard 310 and interposer 110 by aligning opening, threaded boss or collet 320 with opening 420, then turning or adjusting the position of mating board 410 until second opening 440 aligns with alignment post 340. Mating board 410 may also include components, such as components 460, and interconnect lines (not shown).

Figure 5:
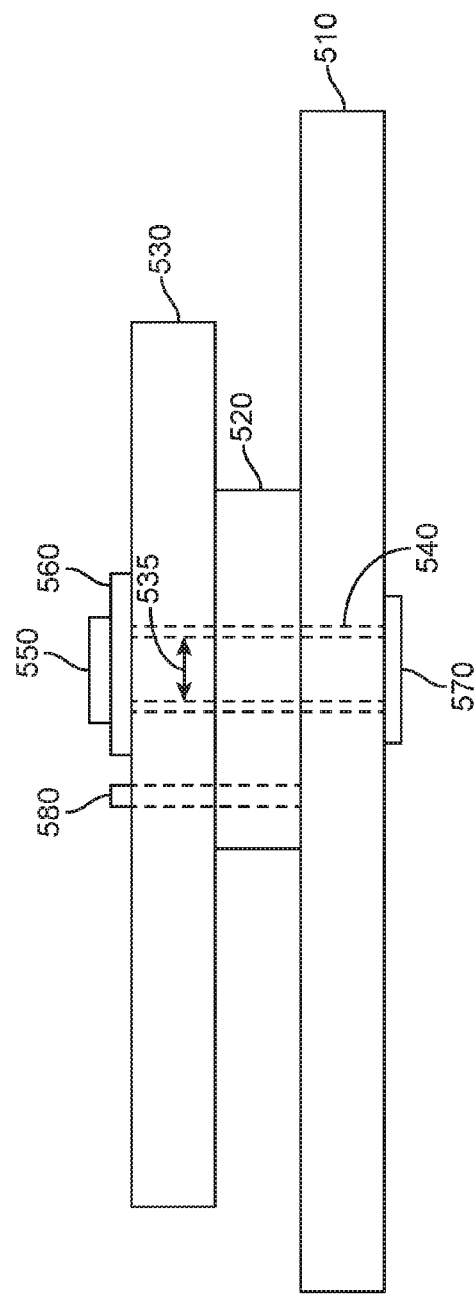
FIG. 5 illustrates a cross section of a mating board, interposer, and motherboard aligned and fastened together according to an embodiment of the present invention.

FIG. 5 illustrates a side view of a motherboard 510, interposer 520, and mating board 530 according to an embodiment of the present invention. In this example, alignment post 580 is fixed to motherboard 510. In other embodiments of the present invention, alignment post 580 may be fixed to another surface, or it may simply reside in an opening in motherboard 510. Opening, threaded boss, or collet 540 is shown passing through motherboard 510. An end piece 570 may be used to secure the threaded boss 540 to motherboard 510. In other embodiments of the present invention, threaded boss or collet 540 may be attached to a top surface of motherboard 510. Threaded boss or collet 540 may have a threaded interior surface for accepting screw 530. In other embodiments of the present invention, other types of fasteners, such as push pins, conical pins, or other types of fasteners may be used.

Interposer 520 may include a first opening for accepting threaded boss, collet, or other fastener 540, and a second opening for accepting an alignment post 580. In other embodiments of the present invention, interposer 520 may include one, two, or three or more openings for various alignment features. In still other embodiments of the present invention, interposer 520 may include one or more alignment features. For example, one or more alignment features may be fixed to, or otherwise associated with, a bottom of interposer 520, to ensure alignment to motherboard 510. Similarly, one or more aligned features may be fixed to, or associate with, a top of interposer 520 to ensure alignment to mating board 530.

Mating board 530 may also include openings for threaded boss or collet 540 and alignment post 580. Mating board 530 may include one or more alignment features for aligning to either interposer 520, or interposer 520 and motherboard 510.

A screw 550 may be threaded into threaded boss 540 to secure motherboard 510, interposer 520, and mating board 530 together. A washer 560 may be used for further mechanical reliability. Washer 560 may be a flat washer, locking washer, or other type of washer. In other embodiments of the present invention, other types of fasteners may be used.

Again, it is desirable for the vertical height of the combination shown in FIG. 5 to have a reduced thickness. Accordingly, some or all of the attachment and alignment features may be set into motherboard 510 or mating board 530. An example is shown in the following figure.

Figure 6:
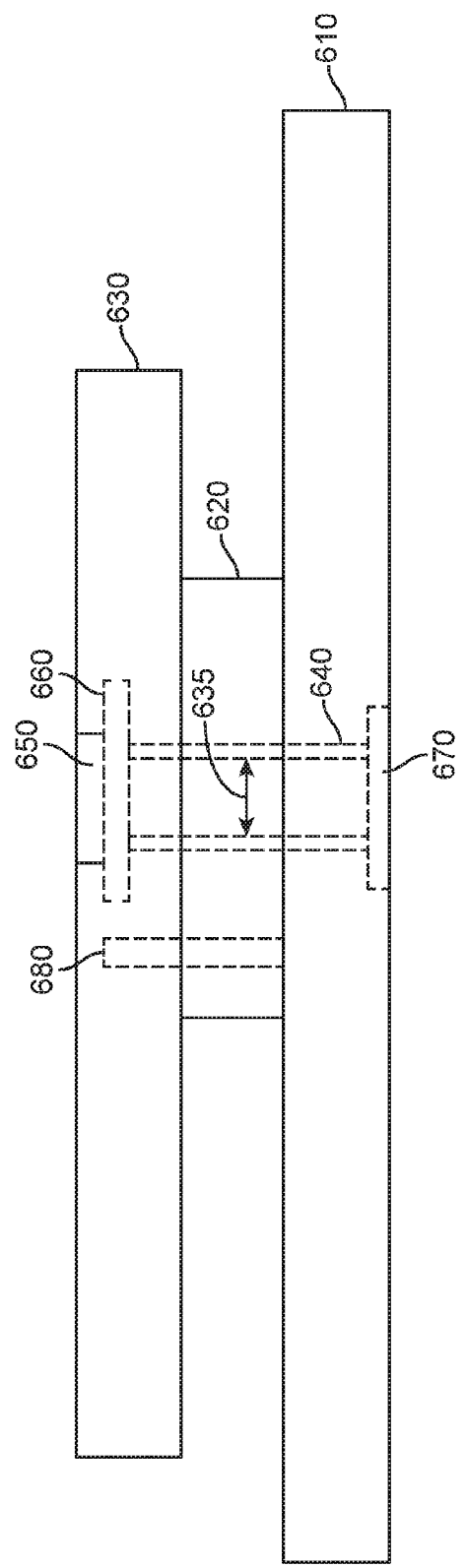
FIG. 6 illustrates another cross section of a mating board, interposer, and motherboard aligned and fastened together according to an embodiment of the present invention.

FIG. 6 illustrates another side view of a motherboard 610, interposer 620, and mating board 630 according to an embodiment of the present invention. In this example, base or end piece 670 of threaded boss 640 is set into motherboard 610, thereby reducing the thickness of the combined stack. Similarly, washer 660 and top of screw 650 are set into mating board 630. Alignment post 680 does not protrude through a top of mating board 630. That is, alignment post 680 is set or recessed into mating board 630. In this example, mating board 630 may not include an opening in its top surface for alignment post 680. Rather, instead of a full opening, a limited opening or indentation in a bottom of mating board 630 may be used.

Again, in various embodiments of the present invention, an interposer may be used to connect a motherboard to other components, such as a set of wires or a flexible circuit board. An example is shown in the following figure.

Figure 7:
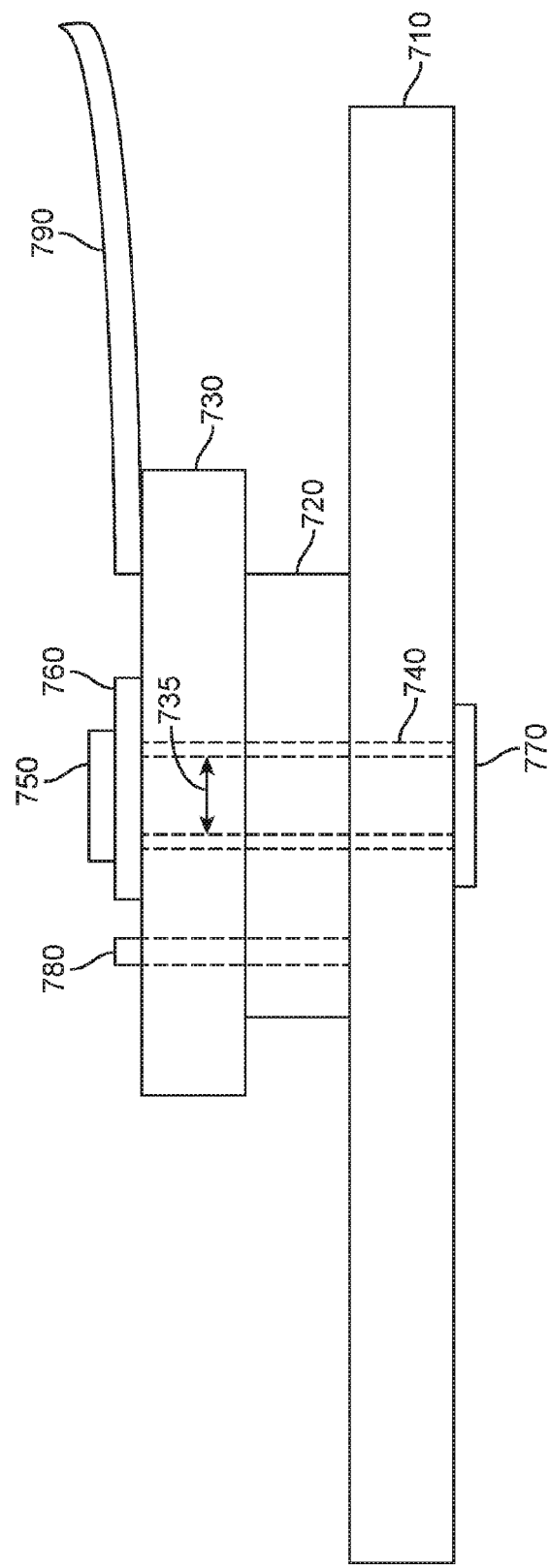
FIG. 7 illustrates another cross section of a mating board, interposer, and motherboard aligned and fastened together according to an embodiment of the present invention.

FIG. 7 illustrates a side view of a mother board 710, interposer 730, mating board 730, and wires or flexible circuit board 790. In this example, interposer 720 provides a high-speed connection between motherboard 710 and wires or flexible circuit board 790. Alignment post 780, and screw 750, threaded boss 740, and washer 760, may be used as before.

Figure 8:
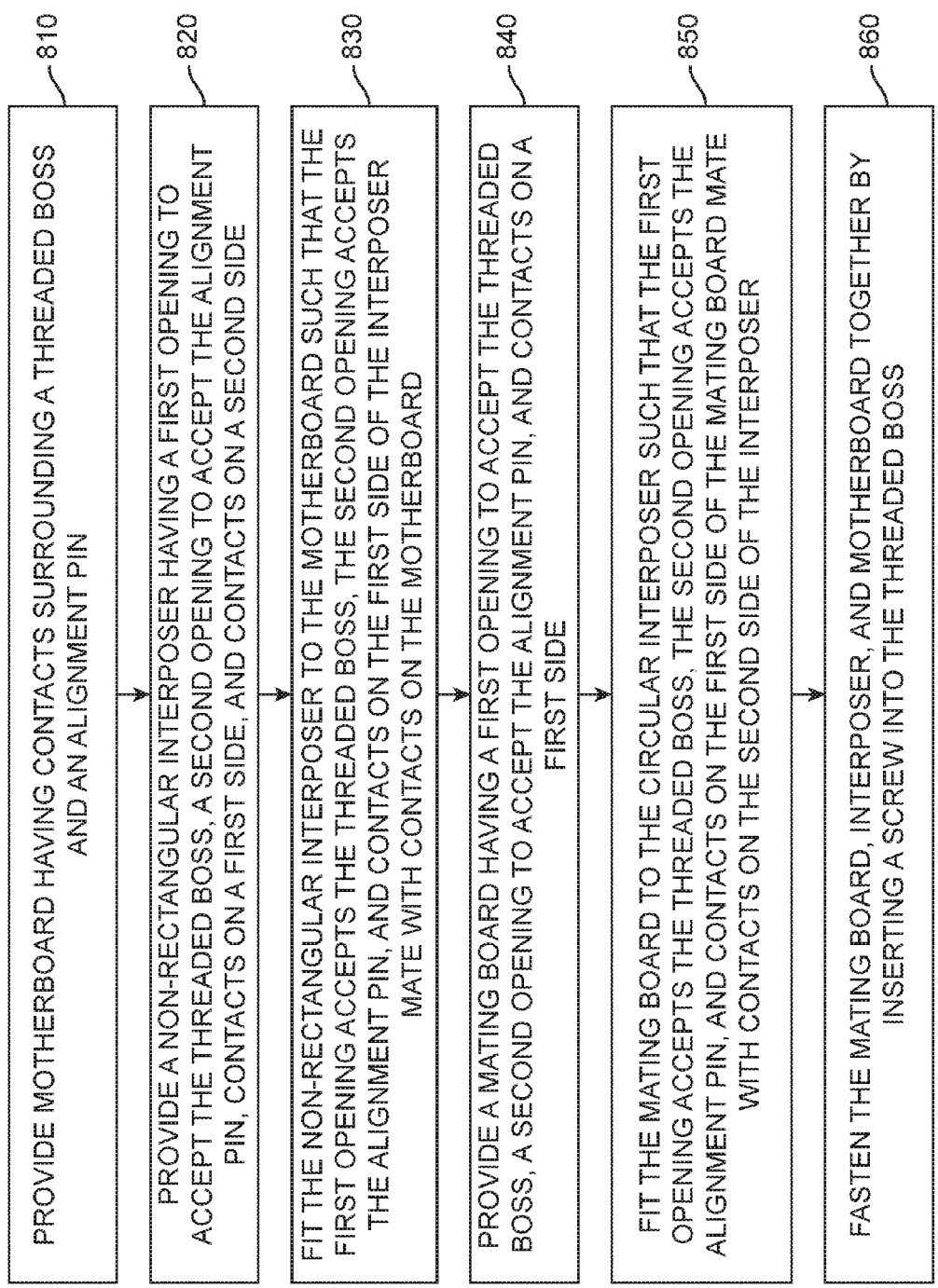
FIG. 8 is a flow chart of a method of assembling a mating board, interposer, and motherboard according to an embodiment of the present invention.

FIG. 8 is a flowchart of a method of manufacturing of electronic component according to an embodiment of the present invention. In act 810, a motherboard having contacts, a threaded boss, and an alignment post is provided. In act 820, a non-rectangular interposer having a first opening to accept the threaded boss, a second opening to accept the alignment post, contacts on a first side, and contacts on a second side, is provided. In a specific embodiment of the present invention, the non-rectangular interposer may be circular. In act 830, the non-rectangular interposer is fit to the motherboard such that the first opening accepts the threaded boss, a second opening accepts the alignment post, and contacts on the first side of the interposer mate with contacts on the motherboard. In act 840, a mating board having a first opening to accept the threaded boss, a second opening to accept the alignment post, and contacts on a first side is provided. In act 850, the mating board is fitted to the non-rectangular or circular interposer such that the first opening accepts the threaded boss, the second opening accepts the alignment post, and contacts on a first side of the mating board mate with contacts on a second side of the interposer. In act 860, the mating board, interposer, and motherboard are fastened together by inserting a screw into the threaded boss.

Again, in other embodiments of the present invention, other types of fasteners besides of screws and threaded bosses may be used. An example is shown in the following figures.

Figure 9:
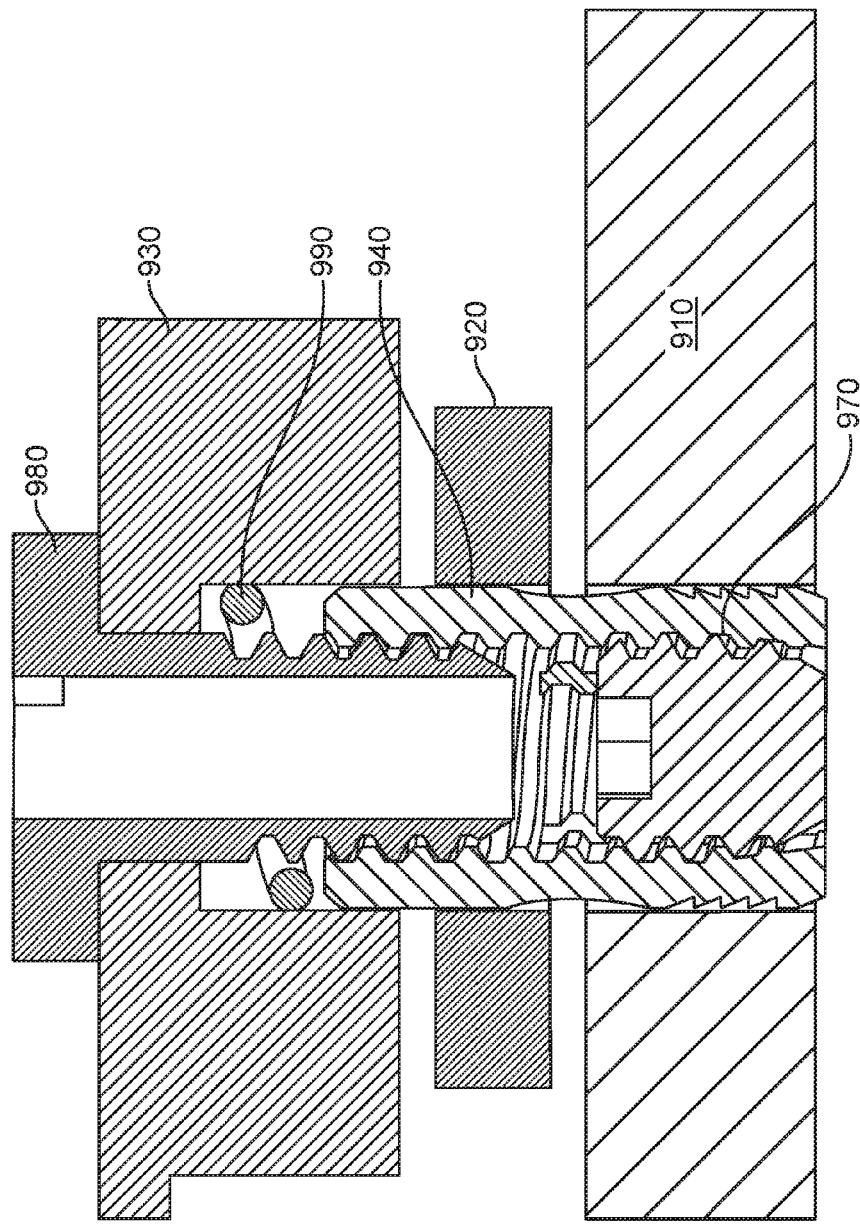
FIG. 9 illustrates another cross section of a mating board, interposer, and motherboard aligned and fastened together according to an embodiment of the present invention.

FIG. 9 illustrates another cross section of a mating board, interposer, and motherboard aligned and fastened together according to an embodiment of the present invention. In this example, an opening in mother or main logic board 910 is aligned with openings in a non-circular interposer 920 and mating board 930. The opening in mother or main logic board 910 may extend through the motherboard 910 as a through hole, or the opening may stop partially through motherboard 910 as a blind hole. Expanding collet 940 may be placed through these openings. Set screw 970 may be used to fasten collet 940 to motherboard 910. Bolt 980 may be used to secure interposer 920 and mating board 930.

In a specific embodiment of the present invention, set screw 970 and bolt 980 may be inserted into collet 940 at the same time. Specifically, set screw 970 may have a threaded or notched top surface for accepting a tool. Bolt 980 may be hollow to allow insertion of the tool into set screw 970. This tool may also turn bolt 980 into place, though a separate tool and separate assembly step may be used to insert bolt 980. Spring 990 may be used to increase contact pressure and maintain mechanical stability.

Figure 10:
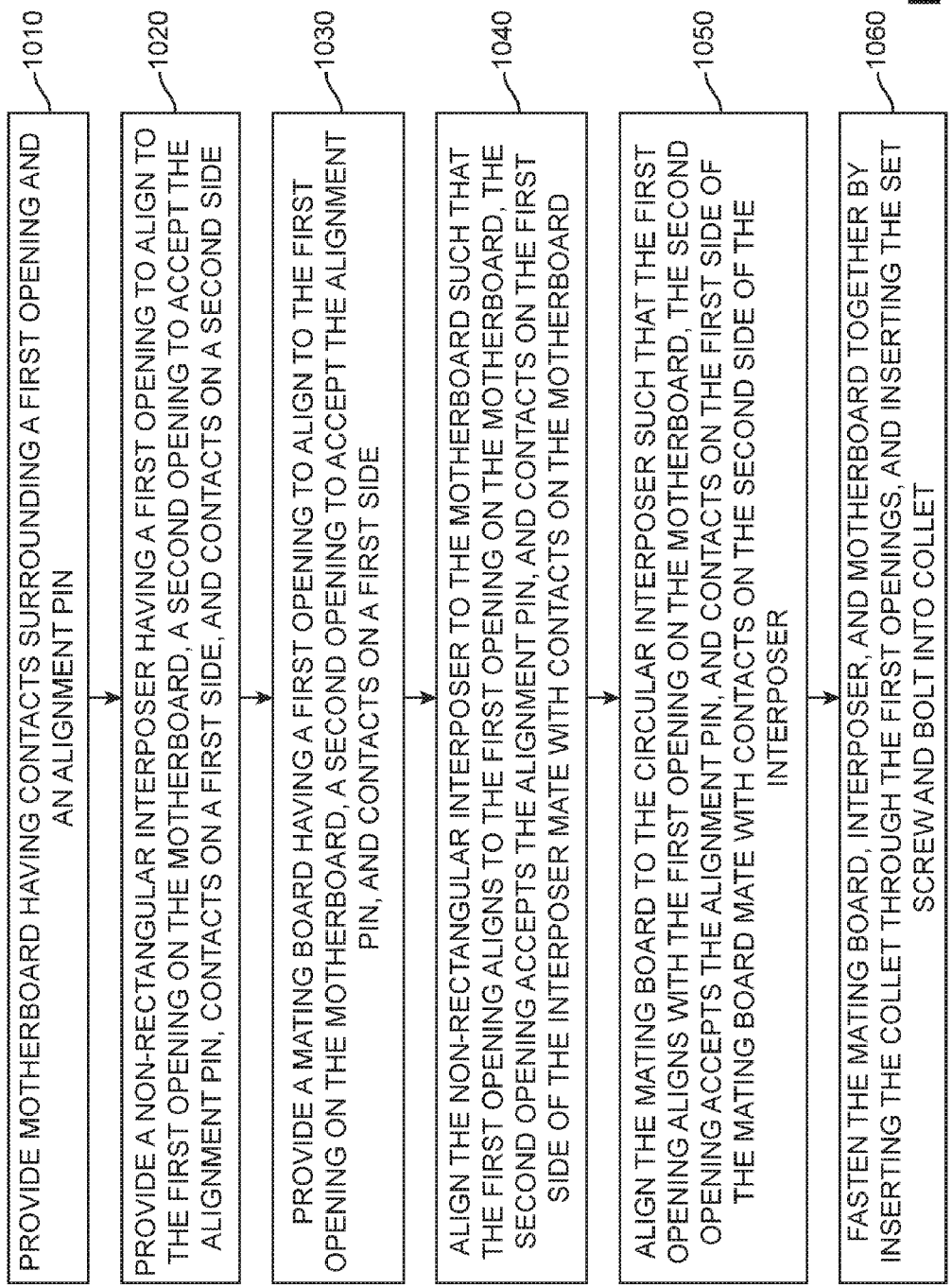
FIG. 10 is another flow chart of a method of assembling a mating board, interposer, and motherboard according to an embodiment of the present invention.

FIG. 10 is another flow chart of a method of assembling a mating board, interposer, and motherboard according to an embodiment of the present invention. In act 1010, a motherboard having contacts around a first opening and an alignment post is provided. A non-rectangular interposer having a first opening to align the first opening on the motherboard, a second opening to accept the alignment post, contacts on a first side, and contacts on a second side, is provided in act 1020. In act 1030, a mating board having a first opening to align to the first opening on a motherboard, a second opening to accept the alignment post, and contacts on a first side is provided.

In act 1040, the non-rectangular interposer may be aligned to the motherboard such that the first opening aligns to the first opening on the motherboard, the second opening accepts the alignment post, and contacts on a first side of interposer mate with contacts on the motherboard. In act 1050, the mating board may be aligned to the circular interposer such that the first opening aligns with the first opening on the motherboard, a second opening accepts the alignment post, and contacts on a first side of the mating board mate with contacts on a second side of interposer. The mating board, interposer, and motherboard may be secured by inserting a collet through the first openings, and a set screw and bolt may be inserted into the collet in act 1060.

Again, in various embodiments of the present invention, interposers may have various shapes and sizes. For example, an interposer may be non-rectangular, or it may be square or rectangular. Also, different numbers of alignment features may be employed. For example, three alignment features may be used. An example of this is shown in the following figure.

Figure 11:
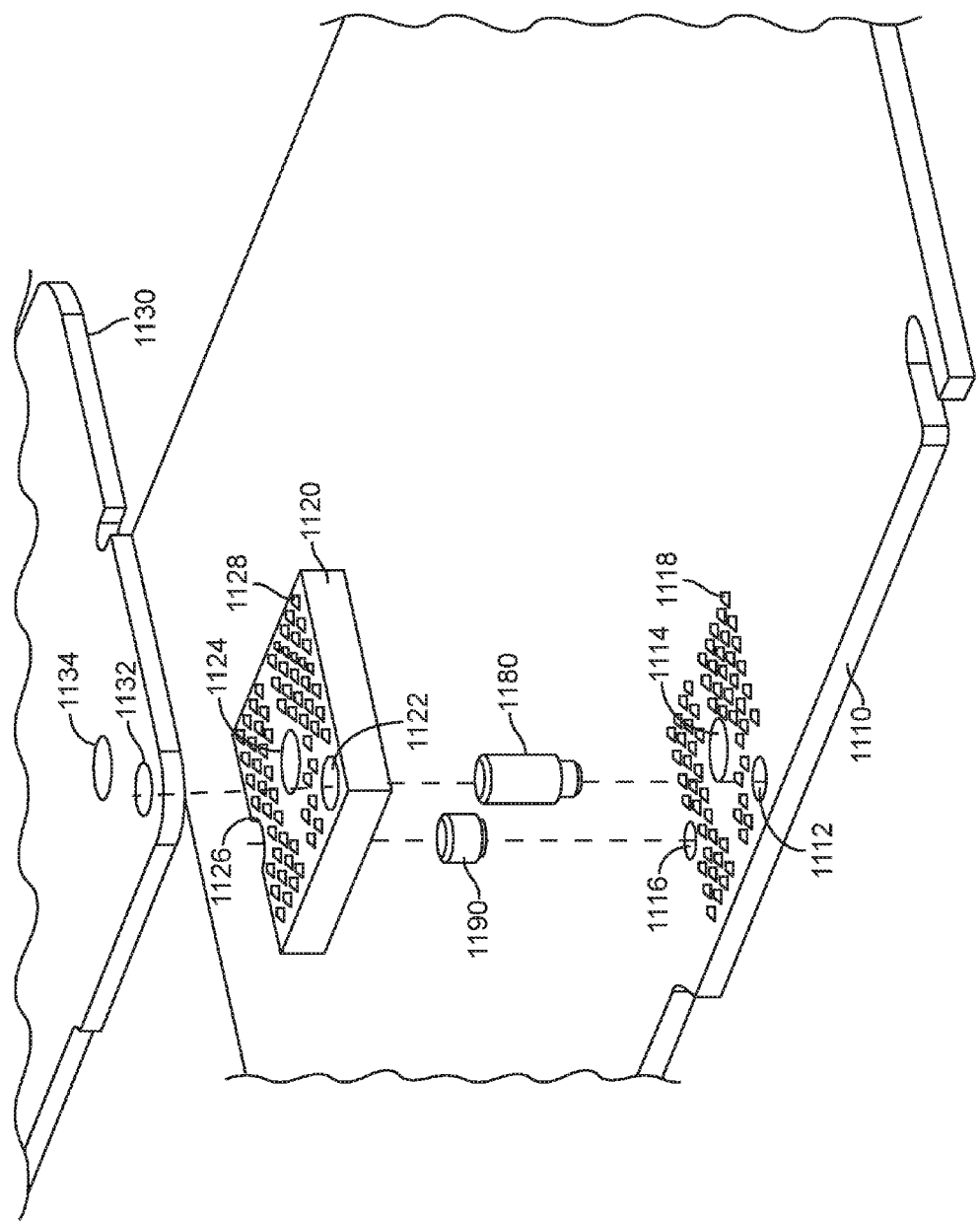
FIG. 11 illustrates a portion of an electronic system according to an embodiment of the present invention.

FIG. 11 illustrates a portion of an electronic system according to an embodiment of the present invention. This figure includes a motherboard or main-logic board 1110 having a first opening 1114, a second opening 1112, and a third opening 1116. A number of contacts 1118 may surround these openings. These contacts may be metal plated contact areas printed on main-logic board 1110. Opening 1114 may be a through hole, while openings 1112 and 1116 may extend only partway into main-logic board 1110. Alignment post 1180 may fit into opening 1112. Alignment pin 1190 may fit into opening 1190.

Interposer 1120 may fit over alignment post 1180 and mate with main-logic board 1110. Specifically, opening 1122 in interposer 1120 may fit over alignment post 1180. A notch 1126 may accept alignment pin 1190. Alignment pin 1190 may prevent clocking or turning of interposer 1120 when interposer 1120 is fastened to main-logic board 1110. Contacts on an underside of interposer 1120 may mate with corresponding contacts 1118 on main-logic board 1110.

Mating board 1130 may fit over alignment post 1180 and mate with interposer 1120. Contacts on an underside of mating board 1130 may mate with contacts 1128 on a top side of interposer 1120. Contacts 1128 and those on the underside of interpose 1120 may be spring contacts such as those shown above in FIG. 2 and the other included examples. Contacts on the underside of mating board 1130 may be metal plated contact areas printed on mating board 1130.

Various fasteners may be used to secure main-logic board 1110, interposer 1120, and mating board 1130 together. For example, the various fasteners described above may be used. Also, a screw may be used. An example is shown in the following figure.

Figure 12:
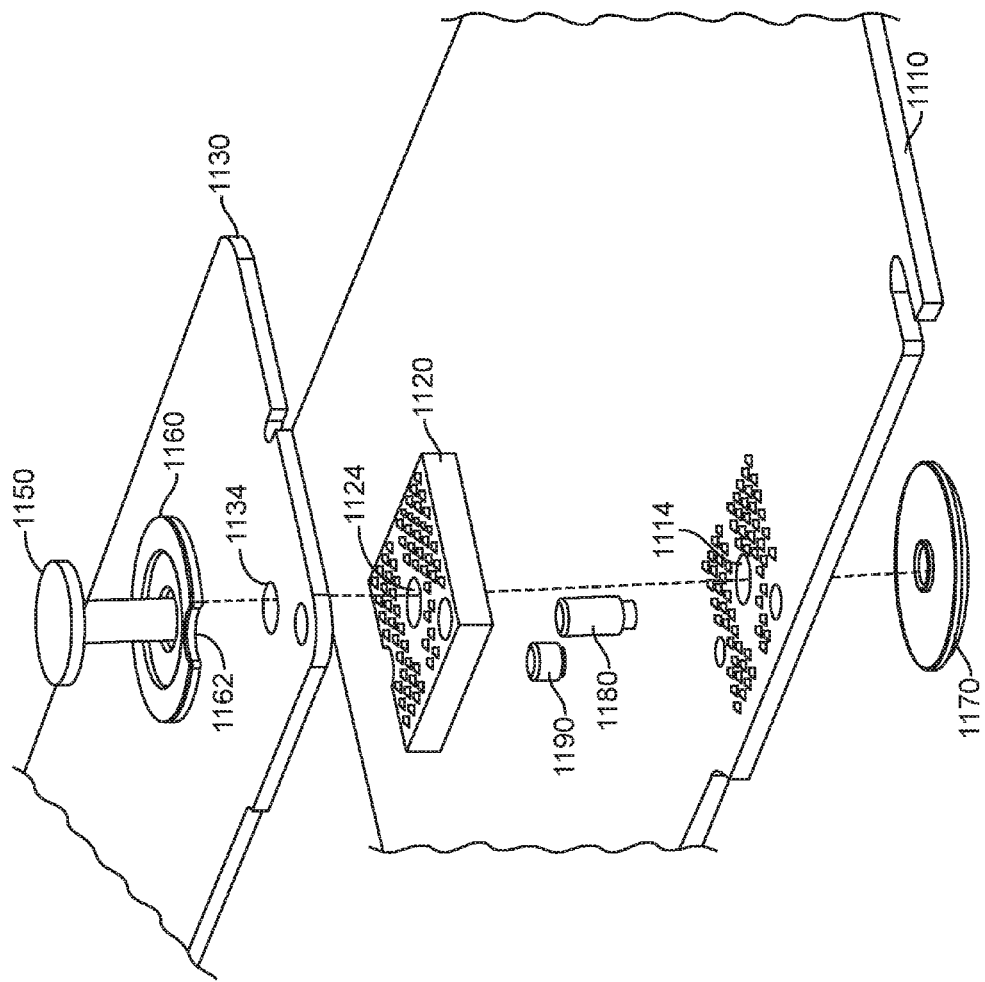
FIG. 12 illustrates a screw fastening together a main-logic board, interposer, and mating board according to an embodiment of the present invention.

FIG. 12 illustrates a screw fastening together a main-logic board, interposer, and mating board according to an embodiment of the present invention. In this example, a screw 1150 may pass through opening 1134 in mating board 1130, opening 1124 in interposer 1120, and opening 1114 in main-logic board 1110. A washer or backer plate 1160 may be used and placed between a head of screw 1150 and mating board 1130. Washer or backer plate 1160 may include a notch 1162 to fit around a top of alignment post 1180. A second threaded backer plate 1170 may be placed under main-logic board 1110. Screw 1150 may be screwed into threads of bracket plate 1170. Backer plate 1160 may have a recessed portion to accept a head of screw 1150 to provide a low profile for the fastener.

Figure 13:
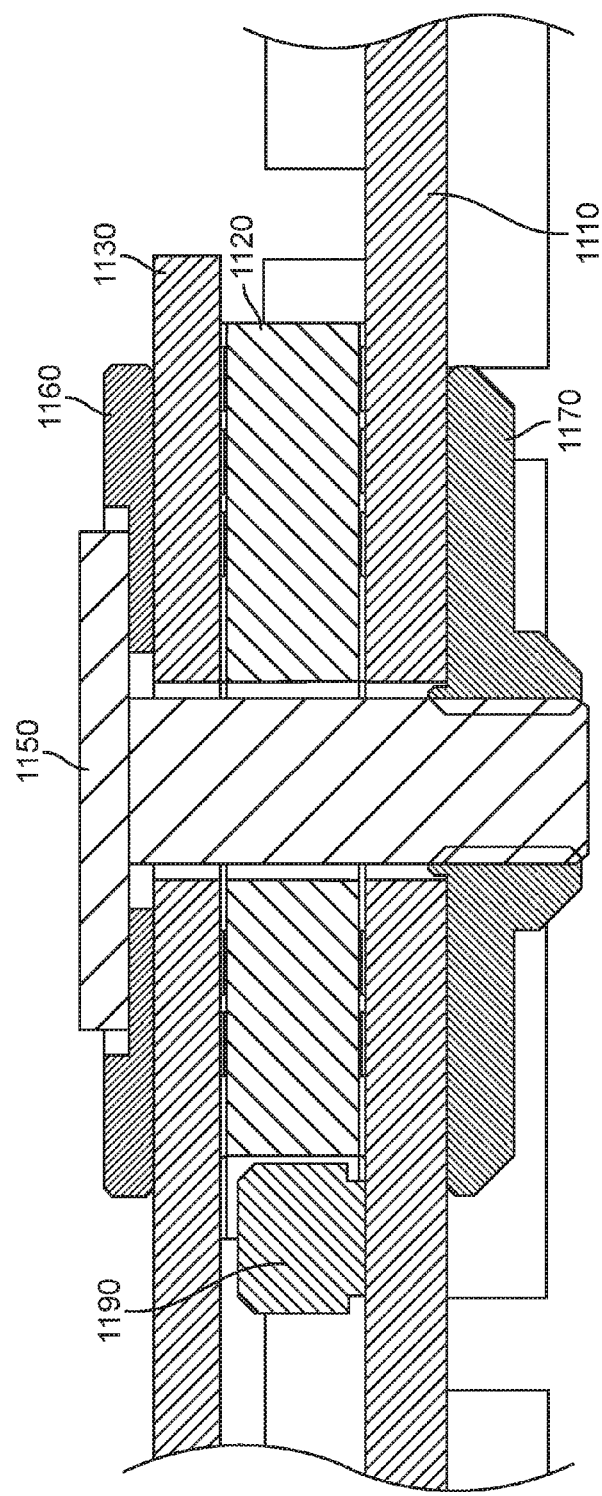
FIG. 13 illustrates a side view of a portion of an electronic system according to an embodiment of the present invention.

FIG. 13 illustrates a side view of the above assembly. In this example, interposer 1120 may reside on main-logic board 1110. Mating board 1130 may reside on interposer 1120. Screw 1150 may pass through these three structures. Backer plates 1160 and 1170 may be used as a washer and threaded portion to secure these features together. Alignment pin 1190 may be used as a third alignment feature, along with screw 1150 and alignment post 1180 (not shown.)

In various embodiments of the present invention, main-logic board 1110, interposer 1120, and mating board 1130 may be used for various functions. For example, main-logic board 1110 may be a main-logic board for a portable computer, portable media player, tablet computer, or other device. Mating board 1130 may be a board for a battery management unit to control a battery in the portable computer, portable media player, tablet computer, or other device. Mating board 1130 may be a board for other circuitry, such as memories, interface circuits, and others.

In various embodiments of the present invention, these various components may be made of various materials. For example, screw 1150 and backer plates 1160 and 1170 may be formed using brass, nickel, steel, stainless steel, low-carbon steel, or other materials. They may be plated, for example with Nickel, matte tin, or other material. They may also be nylon, plastic, or other materials.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of assembling a mating board, interposer, and main-logic board, the method comprising:
   providing a main-logic board having a plurality of contacts placed around a first opening, an alignment post, and an alignment pin;
   providing an interposer having a first opening, a second opening to accept the alignment post, a first notch to accept the alignment pin, a first plurality of contacts on a first side, and a second plurality of contacts on a second side;
   fitting the interposer to the main logic board such that the first opening aligns with the first opening on the main-logic board, the second opening accepts the alignment post, the first notch in an outside edge of the interposer accepts the alignment pin, and the first plurality of contacts mates with the contacts on the main logic board;

providing a mating board having a first opening, a second opening to accept the alignment post, and a plurality of contacts on a first side;

fitting the mating board to the interposer such that the first opening aligns with the first opening on the interposer, the second opening accepts the alignment post, and the plurality of contacts mates with the second plurality of contacts on the interposer; and fastening the mating board, interposer, and main logic board together.

2. The method of claim 1 wherein the interposer is rectangular.

3. The method of claim 1 wherein the interposer is square.

4. The method of claim 1 wherein fastening the mating board, interposer, and main logic board together comprises inserting a screw through the first opening in the mating board, the first opening in the interposer, and the first opening in the main-logic board.

5. The method of claim 4 further comprising inserting a screw through a backer plate, the backer plate located on a top side of the mating board.

6. The method of claim 5 further comprising screwing the screw into a second backing plate located below the main-logic board.

7. The method of claim 5 further comprising aligning a notch in the backer plate to the alignment post.

8. The method of claim 1 wherein the interposer is circular.

9. An electronic device comprising:
a main logic board having a plurality of contacts on a first side, a first alignment feature, a second alignment feature, and an opening for a fastener;
an interposer having a first opening for the fastener, a second opening aligned with the first alignment feature, a first notch in an outside edge of the interposer aligned with the second alignment feature, a first plurality of contacts on a first side aligned with the plurality of contacts on the first side of the main logic board, and a second plurality of contacts on a second side;
a mating board having a first opening for the fastener, a second opening aligned with the first alignment feature, a plurality of contacts on a first side aligned with the second plurality of contacts on the second side of the interposer; and
the fastener holding the mating board, interposer, and main logic board together.

10. The electronic device of claim 9 wherein the interposer is rectangular.

11. The electronic device of claim 9 wherein the interposer is square.

12. The electronic device of claim 9 wherein the fastener comprises a screw.

13. The electronic device of claim 9 wherein the first alignment feature comprises an alignment post.

14. The electronic device of claim 13 wherein the second alignment feature comprises an alignment pin.

15. The electronic device of claim 9 wherein the mating board further comprises a plurality of electronic components.

16. The electronic device of claim 9 wherein the mating board is further attached to a plurality of conductive lines.

17. The electronic device of claim 9 wherein the interposer is circular.

18. An electronic device comprising:
a main logic board having a plurality of contacts on a first side, a first alignment feature, and an opening for a fastener;
an interposer having a first opening for the fastener, a second opening aligned with the first alignment feature, a first plurality of contacts on a first side aligned with the plurality of contacts on the first side of the main logic board, and a second plurality of contacts on a second side;
a mating board having a first opening for the fastener, a second opening aligned with the first alignment feature, a plurality of contacts on a first side aligned with the second plurality of contacts on the second side of the interposer; and
the fastener holding the mating board, interposer, and main logic board together.

19. The electronic device of claim 18 wherein the interposer is rectangular.

20. The electronic device of claim 18 wherein the interposer is square.

21. The electronic device of claim 18 wherein the interposer is circular.

* * * * *